US006430287B1

United States Patent
Rao

(10) Patent No.: US 6,430,287 B1
(45) Date of Patent: Aug. 6, 2002

(54) COMBINED PARALLEL ADAPTIVE EQUALIZER/ECHO CANCELLER

(75) Inventor: Sailesh Krishna Rao, Colts Neck, NJ (US)

(73) Assignee: Level One Communications, Inc., Sacramento, CA (US)

( * ) Notice: Subject to any disclaimer, the term of this patent is extended or adjusted under 35 U.S.C. 154(b) by 0 days.

(21) Appl. No.: 08/924,069

(22) Filed: Aug. 28, 1997

Related U.S. Application Data

(60) Provisional application No. 60/042,469, filed on Mar. 25, 1997.

(51) Int. Cl.[7] .......................... H04M 9/08; G06G 17/10
(52) U.S. Cl. ................................. 379/406.08; 708/319
(58) Field of Search ........................... 381/66; 379/411, 379/410, 406.08; 708/322, 313, 319, 316

(56) References Cited

U.S. PATENT DOCUMENTS

| | | | |
|---|---|---|---|
| 4,074,086 A | | 2/1978 | Duncan et al. |
| 4,615,026 A | | 9/1986 | Schiff |
| 4,779,225 A | * | 10/1988 | Fukasawa et al. ........ 708/322 |
| 4,803,648 A | | 2/1989 | Dierckx et al. |
| 4,947,362 A | * | 8/1990 | Bui ........................... 708/322 |
| 5,005,185 A | | 4/1991 | Mizoguchi et al. |
| 5,191,547 A | | 3/1993 | Kawamoto et al. |
| 5,282,155 A | | 1/1994 | Jones |
| 5,396,517 A | * | 3/1995 | Yedid et al. ................ 379/411 |
| 5,416,799 A | | 5/1995 | Currivan et al. |
| 5,450,339 A | | 9/1995 | Chester et al. |
| 5,517,527 A | | 5/1996 | Yu |
| 5,586,068 A | * | 12/1996 | Rakib ......................... 708/319 |
| 5,590,121 A | | 12/1996 | Geigel et al. |
| 5,590,154 A | | 12/1996 | Forni et al. |
| 5,648,987 A | | 7/1997 | Yang et al. |
| 6,009,448 A | * | 12/1999 | Jong et al. ................. 708/322 |
| 6,260,053 B1 | * | 7/2001 | Maulik et al. .............. 708/313 |

FOREIGN PATENT DOCUMENTS

EP     0 653 839     5/1995

OTHER PUBLICATIONS

Long et al., "The LMS Algorithm with Delayed Coefficient Adaptation," *IEEE Transactions on Acoustics, Speech, and Signal Processing*, vol. 37, No. 9, pp. 1397–1405 (Sep. 1989).

Meyer et al., "A Modular Pipelined Implementation of a Delayed LMS Transversal Adaptive Filter," *IEEE ISCAS*, vol. 3, pp. 1943–1946 (1990).

Chester et al., "A Fully Systolic Adaptive Filter Implementation," *IEEE ICASSP*, vol. 3, pp. 2109–2112 (1991).

C.J. Nicol, P. Larsson, K. Azadet, J. H. O'Neill: "A Low Power 128–tap Digital Adaptive Equalizer for Broadband Modems," *1997 IEEE International Solid–State Circuits Conference* (Digest of Technical Papers). Feb. 608, 1997, pp.94–95, 437.

* cited by examiner

*Primary Examiner*—Forester W. Isen
*Assistant Examiner*—Brian Pendelton
(74) *Attorney, Agent, or Firm*—Merchant & Gould PC

(57) ABSTRACT

A combined, parallel adaptive equalizer/echo canceller is disclosed. The equalizer/canceller receives at least one input signal which is split into n taps. The n taps are multiplied by corresponding n tap coefficients to produce n tap output signals. The n tap output signals are then processed through an additive pipeline to produce a filter output signal. The additive pipeline provides low latency by processing the nth most recent tap output signal n clock cycles from the filter output signal. The combined FIR filter structure is made fully adaptive using delayed LMS coefficient adaptation. Tap coefficients are updated using an error signal and delayed versions of the input signal. The error signal is a product of a calculated error and a negative adaptation factor. The delay is equal to a sum of n+1 cycles.

12 Claims, 3 Drawing Sheets

COMBINED PARALLEL ADAPTIVE EQUALIZER/ECHO CANCELLER

This application claims the benefit of U.S. Provisional Application No. 60/042,469 filed Mar. 25, 1997.

BACKGROUND OF THE INVENTION

1. Field of the Invention

This invention relates in general to digital filtering, and more particularly to combined parallel adaptive equalizer/echo canceller that minimizes memory requirements and circuit complexity.

2. Description of Related Art

"Communication" is the exchange of thoughts, opinions, ideas, and information. It is the means to socialize, do business, educate, and entertain. Communication can take many forms, such as spoken words, written letters, or symbols. Although face to face communication is often desirable, it is often not possible due to geographical distance, time constraints, and an ever-increasing need for a high volume of information in today's society. It is for this reason that information, or data, is sent over communications "channels," via "signals."

A communications channel is a single path for transmitting an electrical signal, such as a twisted wire-pair cable, or a fiber optic line. A signal is a physical representation of data, such as the electrical pulses which are used to correspond to digital logic levels.

Signals are sent, or transmitted, in a tremendous variety of forms. For example, signals are used to send voice information over a telephone line; modems use signals to transmit data between computers; signals are constantly sent between the CPU and disk storage device in a personal computer; and signals representing images and sound are transmitted from a television camera on-site, to the television in a viewer's living room that could be thousands of miles away.

Signal distortion or degradation is a significant problem in the field of communications. Any real communications channel has transmission deficiencies, including various kinds of noise and interference, which distort the signal. For example, static noise (caused by natural electric disturbances in the atmosphere) and thermal noise (caused by the random motion of electrons in the channel) are present to some extent in any communications channel. Intersymbol interference (degradation caused by imperfect channels) can also be a major problem. In short, there are many reasons why a signal that is sent may be unrecognizable when it is received.

Thus, transmission deficiencies must be corrected so that the signal received is the same as the one that was sent, and valuable information is not lost. This correction can be accomplished by the signal receiver, through a process known as equalization.

Equalization is the process of correcting a channel for its transmission deficiencies, by introducing networks which compensate for attenuation and time delay problems in the signal. A properly equalized communications channel will significantly increase the likelihood of obtaining an accurate signal (i.e., the signal that was sent) at the receiving end of a communications network. An equalizer is a device used to accomplish equalization.

In addition, impedance mismatches in the transmission media often cause signal echoes. Echo cancellation is the process of eliminating such echoes from the signal path. To cancel the echo signal, a basic operation is implemented: subtraction. Overall, an estimate of the echo signal is generated by adaptive compensation circuit and then subtracted from the echo signal itself. The compensation circuit is fed by both the original signal to be transmitted and the residual signal that results after the echo cancellation takes place. The original signal is used to create the echo signal estimate and the residual signal is used for the adaptation process within the compensation circuit to improve the quality of the estimate echo signal. The adaptive compensation circuit and the subtraction circuit, the circuit that takes the estimate and subtracts it from the received signal, form the echo canceller.

A filter is generally used in equalizer/echo canceller circuits. A filter may have a means of monitoring its own frequency response characteristics and a means of varying its own parameters by closed loop action, in order to attain optimal equalization or echo cancellation. Such a self-adjusting filter is called an adaptive filter, and it can be used in a channel receiver. The parameters of an adaptive filter are typically adjusted by sampling the filter output at a predetermined rate, and sending this sampled output to some filter control means, which adjusts filter parameters accordingly via closed loop feedback.

Commonly, a feed forward equalizer or echo canceller has weighted summed delayed versions of an input signal, which are used to derive an error signal. Further, known Least Means Square (LMS) algorithms have generally been implemented to negate the effects of channel-induced intersymbol interference and to promote efficient echo estimation. To accomplish this, periodically running cross-correlations that are weighted by a feedback weighing factor are loaded into a finite impulse response (FIR) filter. The cross-correlation used for a given filter coefficient corresponds to the symbol data sample position of a delay register and a relative delay of the error corresponding to that sample. In doing this, a tap weight vector update is produced.

However, the standard transversal LMS implementation has several disadvantages or limitations. For long filter applications, the summation tree formed with the summation blocks present latency problems. Such latency problems are especially problematic in very high-speed applications such as Gigabit Ethernet or Fast Ethernet. Further, an adaptive filter must have a sufficient number of taps to provide the requisite sampling of the signal. However, the performance of the transversal equalizer is improved by increasing the sampling rate to a value at least greater than twice the bandwidth of the received signal. Thus, memory requirements increase with increased bandwidth.

It can be seen that there is a need for a combined adaptive equalizer/echo canceller that provides low latency for high-speed applications.

It can also be seen that there is a need for a combined adaptive equalizer/echo canceller that minimizes the memory requirements for implementing the filtering/echo cancellation functions.

SUMMARY OF THE INVENTION

To overcome the limitations in the prior art described above, and to overcome other limitations that will become apparent upon reading and understanding the present specification, the present invention discloses digital filter.

The present invention solves the above-described problems by providing a combined parallel adaptive equalizer/echo canceller that minimizes memory requirements and circuit complexity.

A system in accordance with the principles of the present invention includes at least one transverse finite impulse response filter receiving a plurality of taps from a data input signal that are processed using tap coefficients to produce a plurality of tap outputs, an additive pipeline for receiving the tap outputs and processing the tap outputs through the pipeline to produce an output signal and a coefficient processor for calculating updated tap coefficients, the updated tap coefficients calculated using an error signal and delayed versions of the input signal.

Other embodiments of a system in accordance with the principles of the invention may include alternative or optional additional aspects. One such aspect of the present invention is that a most recent tap output is received by the pipeline one cycle from the output signal.

Another aspect of the present invention is that each filter receives an input signal and provides n tap signals to corresponding n multipliers, wherein the nth multiplier provides an nth tap output signal resulting from the product of the nth tap signal and an nth tap coefficient.

Another aspect of the present invention is that the pipeline further includes n adders having inputs for receiving the n tap output signals and an output for providing a sum signal representing the sum of the n received tap output signals and n-1 registers having an input and an output, the input of each register being coupled to an output of an adder, and the output of each register being passed to an input of a next one of the adders in a pipeline manner according to a next cycle.

Yet another aspect of the present invention is that the tap outputs are received by the pipeline such that each nth adder receives all nth tap output signals.

Another aspect of the present invention is that the error signal comprises a product of a calculated error and a negative adaptation factor.

Another aspect of the present invention is that the delay is equal to a sum of one cycle and a length of the at least one transverse finite impulse response filters.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides a parallel architecture for implementing adaptive feedforward/feedback equalizers and echo cancellers in a combined fashion. The present invention minimizes the amount of registers necessary for implementing the filtering/echo cancellation functions and eliminates the need for separate multiplier precoding circuitry at the input of each feedforward tap multiplier. The architecture inherently has very low latency and it is thus useful for line equalization and echo cancellation in very high-speed applications such as Gigabit Ethernet or Fast Ethernet, where the overall latency of the computations is a critical factor for the correctness of operation of the overall system.

Figure 1:
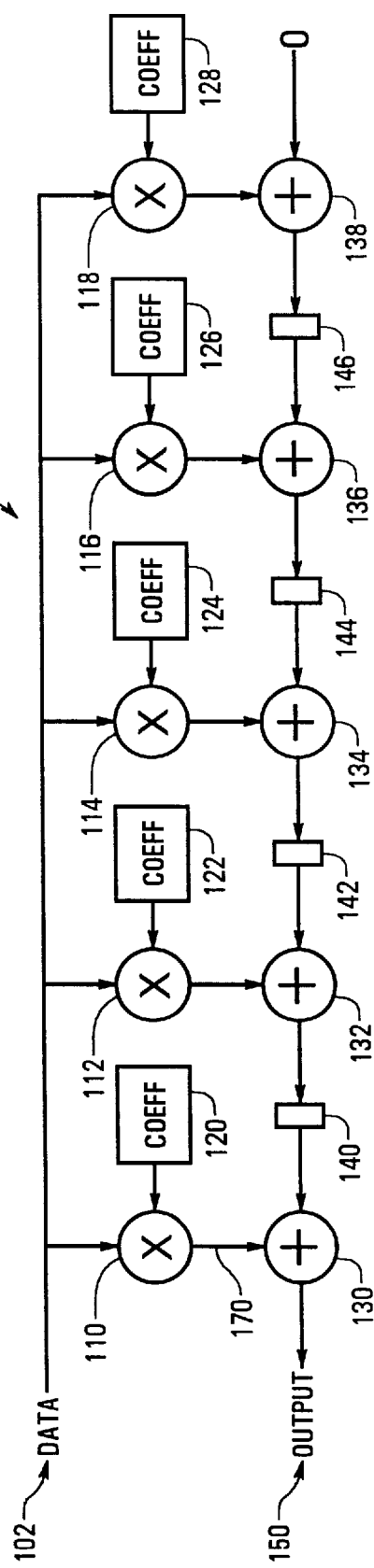
FIG. 1 illustrates a transverse Finite Impulse Response (FIR) filter.

FIG. 1 illustrates a transverse Finite Impulse Response (FIR) filter 100. In FIG. 1, input data 102 is received by the FIR filter 100. The input data 102 is tapped to provide samples to each multiplier 110–118. Each of the data samples 102 are multiplied by an array of constants or tap coefficients 120–128. The output of each multiplier 110–118 is then pipelined through adders 130–138 and registers 140–146. The output 150 of the final adder 130 is the output of the FIR filter 100.

Transverse Finite Impulse Response (FIR) filters 100 are known to provide distinct advantages in terms of parallel hardware implementations. Since, the input data 102 is broadcast to all multipliers 110–118 in the filter 100, the input data 102 can be precoded for the multiplication operation and then broadcast. This saves the step of precoding the data in each multiplier 110–118 in the FIR taps. In addition, the output 150 is pipelined so that the filter 100 can be operated at high clock rates. The most recent tap 170 in the FIR filter 100 is just prior to the final output 150. Therefore, the latency of the filter is minimized. In applications such as Ethernet where latency is a critical issue, this provides an added advantage.

Figure 2:
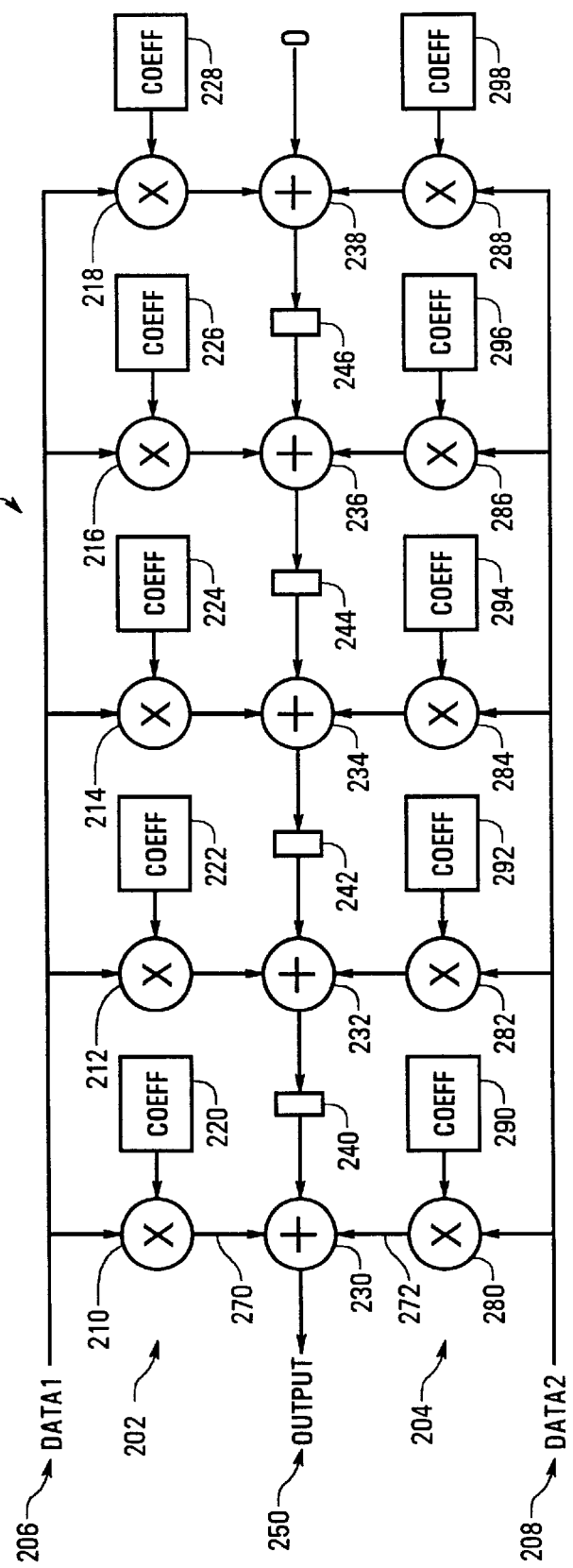
FIG. 2 illustrates multiple independent FIR filters of the same length combined in a transverse architecture according to the present invention.

FIG. 2 illustrates multiple independent FIR filters of the same length combined in a transverse architecture 200. Multiple independent FIR filters of the same length 202, 204 (n taps) can be easily combined in a transverse architecture. A first data signal 206 is received by the first FIR filter 202. A second data signal 208 is received by the second FIR filter 204. Each input data signal 206, 208 is tapped to provide samples to multipliers 210–218, 280–288. Each of the data samples 206, 208 are multiplied by an array of constants or tap coefficients 220–228, 290–298 to provide the desired filter response. The output of each multiplier 210–218, 280–288 is then pipelined through adders 230–238 and registers 240–246. The output 250 of the final adder 230 is the output of the FIR filter 200. The final adder 230 receives the most recent tap outputs 270, 272. The outputs of the multipliers 210–218, 280–288 are accumulated in a column fashion prior to the registers 240–246 such that every nth adder 230–238 receives the corresponding nth output of the multipliers 210–218, 280–288. Thus, the final output 250 is the sum of the outputs of the individual FIRs 202, 204.

While FIG. 2 illustrates two such FIR filters combined 202, 204, those skilled in the art will readily recognize that the principle can be extended to any multiple number of filters. The number of registers needed remains the same, regardless of whether a single, individual filter or multiple filters are used. Accordingly, non-adaptive feedback, feedforward equalizers and echo cancellers may be combined to provide a single output while minimizing the number of registers.

Nevertheless, a combined FIR filter structure must be fully adaptive so that each coefficient in the structure is updated according to the LMS algorithm. According to the present invention, the combined FIR filter structure is made fully adaptive using delayed LMS coefficient adaptation. In normal LMS adaptation:

$$C_n[k]=C_n[k-1]+\text{error }[k-1]*\alpha*data\,[k-1-n],$$

where the $n^{th}$ coefficient at step k is computed in terms of the error at step [k−1] and alpha ($\alpha$) is a negative adaptation factor.

Typically, in high speed applications, the term "$\alpha^*$ error [k−1]" is reduced to a small fixed precision number, e.g., 3 bits, such that the adaptation hardware is negligible in complexity. In a delayed LMS coefficient adaptation, e.g., with delay d, $$C_n[k]=C_n[k-1]+\text{error }[k-1-d]*\alpha*data[k-1-n-d].$$

In particular, if the delay d is chosen to be "1+length of FIR filter" in the transverse FIR filter architecture, the adaptation can also be done in a similar parallel transverse structure.

Figure 3:
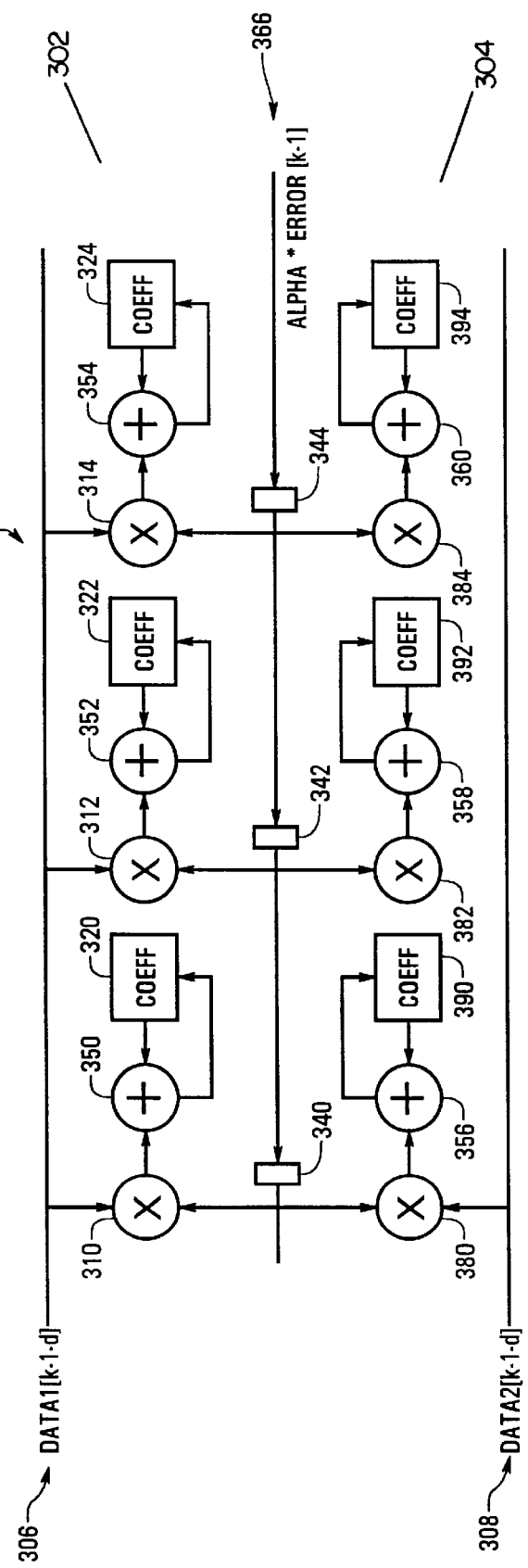
FIG. 3 illustrates Multiple Independent FIR filters for calculating delayed LMS coefficients for use in the FIR of FIG. 2.

FIG. 3 illustrates Multiple Independent FIR filters for calculating delayed LMS coefficients 300 for use in the FIR 200 of FIG. 2. In FIG. 3, the computed error 366 is fed into a register chain 340–344. For purpose of illustration, a three register chain 340–344 is shown in FIG. 3. However, those skilled in the art will recognize that the length of the register chain 340–344 is selected so that the coefficients 320–324, 390–394 correspond to the coefficients 224–228, 294–298 in FIG. 2. In actuality, the filters 302, 304 are extended to calculate coefficients factors for coefficients 320–322, 390–392. The computed error 366 is fed into the register chain 340–344 to achieve the proper correlation of the error and the data term 306, 308. The coefficients 320–324, 390–394 of the two adaptive filters 302, 304 are then updated simultaneously using the output of the error register chain 340–344 and delayed versions ("data1 [k−1−d]") of the original data streams 306, 308. The updated coefficients 320–324, 390–394 are then used to corresponding coefficients 224–228, 294–298 in the filter 200 of FIG. 2 to form the next output 250.

In summary, the combination of all necessary adaptive filtering functions such as echo cancellation, feedforward and feedback equalization in a single repeatable macro-tap with minimum number of pipeline registers are integrated into a combined transverse FIR filter architecture. The inherent hardware advantages of the transverse FIR architecture facilitates the adaptation modifications thereby resulting in these benefits. The adaptation method also makes use of the transverse FIR filter architecture in a parallel fashion. This results in an extensible minimum latency architecture and is thus useful in applications such as Ethernet where the overall latency of the system is a major consideration.

The use of a transverse FIR filter architecture provides commonality for multiplier preceding functions and thus reduces hardware requirements. The combination of feedforward, feedback equalization and echo cancellation in a single repeatable macro-tap also eases the implementation of the architecture on silicon. The inherent minimum latency nature of the architecture meets a critical need in applications such as Gigabit Ethernet or Fast Ethernet where the overall latency of the system is a major consideration.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A combined, parallel adaptive equalizer/echo canceller, comprising:

a plurality of transverse finite impulse response filters, each filter receiving an input signal and providing n tap signals to n multipliers, wherein each multiplier provides a tap output signal resulting from the corresponding tap signal and a corresponding tap coefficient;

an iterative pipeline, coupled to the plurality of filters, the iterative pipeline comprising n−1 registers having an input and an output and n adders, wherein each of the n−1 registers is disposed between two of the n adders with the output of the registers being passed to an input of a next one of the adders in the iterative pipeline, each of the n adders having a first set of inputs for receiving tap output signals from each of the plurality of transverse finite impulse response filters and a second input for receiving the output of one of the n−1 registers, the n adders providing a sum signal representing a sum of the received tap output signals from each of the plurality of transverse finite impulse response filters and the output of one of the n−1 registers; and a coefficient processor, coupled to the filters, for calculating updated tap coefficients, the updated tap coefficients calculated using an error signal and delayed versions of the input signal, wherein an error register chain is provided to output the error signal.

2. The combined, parallel adaptive equalizer/echo canceller of claim 1 wherein a most recent tap output is received by the pipeline one cycle from the output signal.

3. The combined, parallel adaptive equalizer/echo canceller of claim 1 wherein the error signal comprises a product of a calculated error and a negative adaptation factor.

4. The combined, parallel adaptive equalizer/echo canceller of claim 3 wherein the delay is equal to a sum of one cycle and a length of the at least one transverse finite impulse response filters.

5. The combined, parallel adaptive equalizer/echo canceller of claim 1 wherein the delay is equal to a sum of one cycle and a length of the at least one transverse finite impulse response filters.

6. The combined, parallel adaptive equalizer/echo canceller according to claim 2, wherein the error resister chain outputs the error signal and the error signal and the delayed versions of the input signal obtain the updated tap coefficients simultaneously.

7. A method of providing parallel adaptive equalization and echo cancellation, comprising the steps of:

receiving input signals at a plurality of transverse finite impulse filters;

splitting the input signals at each transverse finite impulse filter into a plurality of tap signals;

multiplying each of the tap signals for each transverse finite impulse filter by a tap coefficient to produce a tap output signal;

receiving the tap output signals from each of the plurality of transverse finite impulse filters at an iterative pipeline;

summing the received tap output signals from the plurality of transverse finite impulse filters and an output from one of a plurality of registers having an input and an output, the input of each register being coupled to an output of an adder and the output of each register being passed to an input of a next one of the adders in a pipeline manner according to a next cycle; and calculating updated tap coefficients using a coefficient processor, the updated tap coefficients calculated using an error signal and delayed versions of the input signal, wherein wherein an error register chain is provided to output the error signal.

8. The method of claim 7 wherein the error signal comprises a product of a calculated error and a negative adaptation factor.

9. The method of claim 8 wherein the delay is equal to a sum of n+1 cycles.

10. The method of providing parallel adaptive equalization and echo cancellation according to claim 7, wherein the error resister chain outputs the error signal and the error signal and the delayed versions of the input signal obtain the updated tap coefficients simultaneously.

11. A combined, parallel adaptive equalizer/echo canceller, comprising:

a plurality of transverse finite impulse response filters, each filter receiving an input signal and providing a plurality of tap signals to a corresponding plurality of multipliers, wherein each multiplier provides a tap output signal resulting from the product of the tap signals and a tap coefficient;

an iterative pipeline, coupled to the plurality of filters, the iterative pipeline comprising a plurality of registers and a plurality of adders, wherein the registers and the adders are coupled alternate to each other with an output of the registers being passed to an input of a next one of the adders in the iterative pipeline, and an output of the adders being passed to an input of a next one of the registers, each of the adders having a first set of inputs for receiving tap output signals from each of the plurality of transverse finite impulse response filters and a second input for receiving the output of one of the registers, the adders providing a sum signal representing a sum of the received tap output signals from each of the plurality of transverse finite impulse response filters and the output of one of the registers; and a coefficient processor, coupled to the filters, for calculating updated tap coefficients, the updated tap coefficients calculated using an error signal and delayed versions of the input signal, wherein wherein an error register chain is provided to output the error signal.

12. The combined, parallel adaptive equalizer/echo canceller according to claim 11, wherein the error resister chain outputs the error signal and the error signal and the delayed versions of the input signal obtain the updated tap coefficients simultaneously.

* * * * *